(12) United States Patent  (10) Patent No.: US 6,617,241 B1
Doan  (45) Date of Patent: Sep. 9, 2003

(54) METHOD OF THICK FILM PLANARIZATION

(75) Inventor: My The Doan, Singapore (SG)

(73) Assignee: Institute of Microelectronics, Singapore (SG)

(*) Notice: Subject to any disclaimer, the term of this patent is extended or adjusted under 35 U.S.C. 154(b) by 0 days.

(21) Appl. No.: 10/345,761

(22) Filed: Jan. 15, 2003

(51) Int. Cl.$^7$ ............................................. H01L 21/4763
(52) U.S. Cl. ........................ 438/626; 438/631; 438/633; 438/692; 438/697; 438/699; 438/723; 438/724; 438/725; 438/782; 438/786; 438/787; 438/791
(58) Field of Search ................................. 438/622–624, 438/626, 631, 633, 692, 697, 699, 723–725, 738, 780, 782, 786–787, 789, 790–791

(56) References Cited

U.S. PATENT DOCUMENTS

| | | | |
|---|---|---|---|
| 4,954,459 A | | 9/1990 | Avanzino et al. ............ 437/228 |
| 5,015,602 A | | 5/1991 | Van Der Plas et al. ........ 437/67 |
| 5,445,996 A | * | 8/1995 | Kodera et al. .............. 438/633 |
| 5,532,191 A | * | 7/1996 | Nakano et al. ............. 438/692 |
| 5,958,800 A | * | 9/1999 | Yu et al. .................... 438/633 |
| 6,025,270 A | | 2/2000 | Yoo ............................ 438/697 |
| 6,048,800 A | * | 4/2000 | Nagashima et al. ........ 438/633 |
| 6,063,702 A | * | 5/2000 | Chung ........................ 438/626 |
| 6,200,912 B1 | * | 3/2001 | Aoi ............................ 438/780 |
| 6,221,560 B1 | * | 4/2001 | Soo et al. .................. 438/697 |
| 6,251,788 B1 | * | 6/2001 | Liou .......................... 438/692 |
| 6,265,315 B1 | * | 7/2001 | Lee et al. ................... 438/626 |
| 2002/0034884 A1 | * | 3/2002 | Whitman et al. ........... 438/782 |
| 2002/0132492 A1 | * | 9/2002 | Kim et al. .................. 438/738 |
| 2003/0038109 A1 | * | 2/2003 | Dokumaci et al. .......... 438/692 |

* cited by examiner

Primary Examiner—John F. Niebling
Assistant Examiner—Lynne Gurley
(74) Attorney, Agent, or Firm—George O. Saile; Stephen B. Ackerman

(57) ABSTRACT

Planarization of the top surfaces of layers that are more than about a micron thick is beset with problems not encountered in thinner layers. These problems have been overcome by means of a process that, initially allows the formation of 'horns' in the surface that is to be planarized. Said horns are then selectively etched away while other parts of the surface are protected, following which CMP is initiated and the surface gets planarized. A total of four embodiments are disclosed.

11 Claims, 3 Drawing Sheets

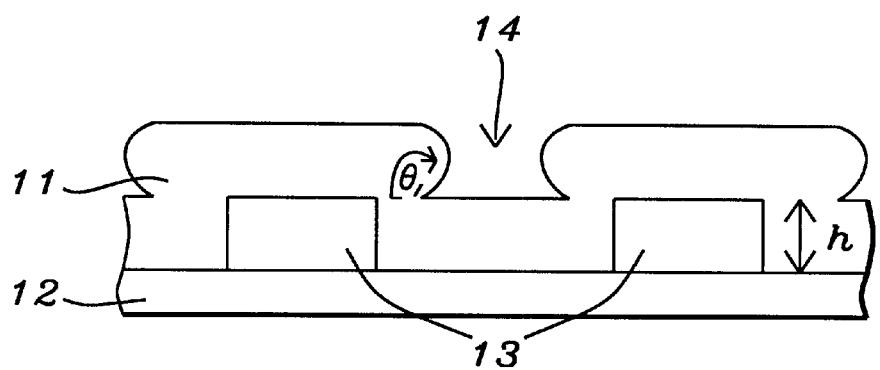
FIG. 1 – Prior Art
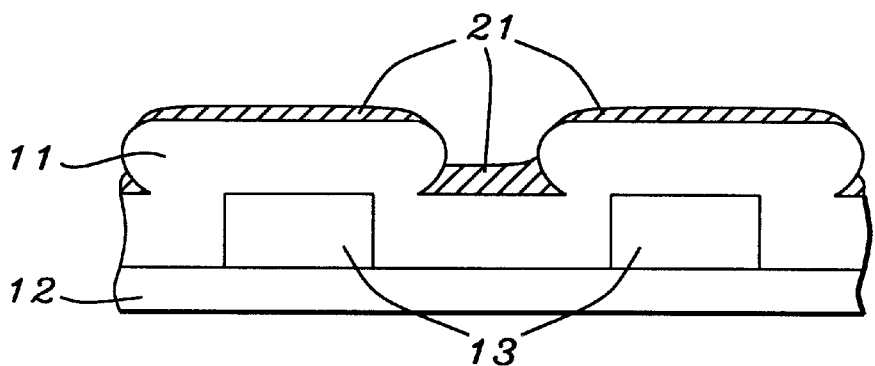
FIG. 2 – Prior Art
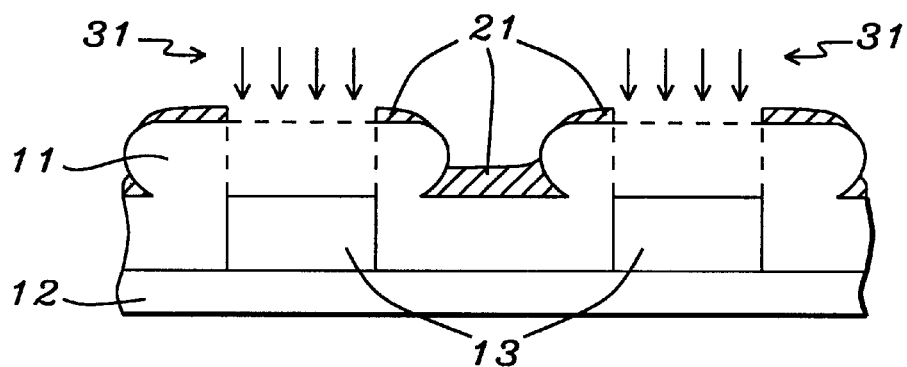
FIG. 3 – Prior Art

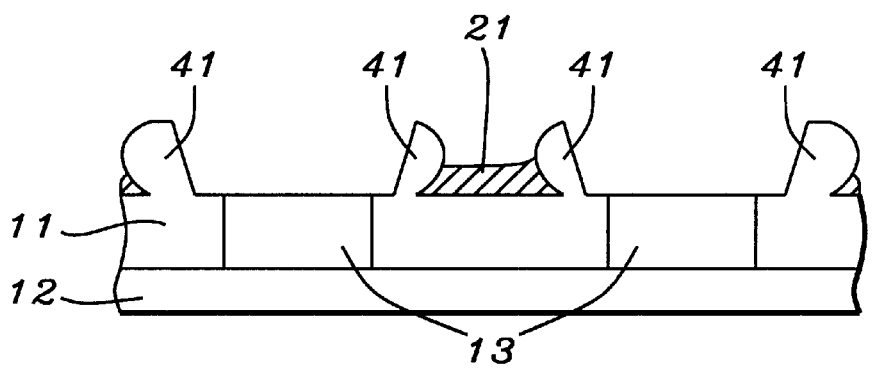
*FIG. 4 - Prior Art*
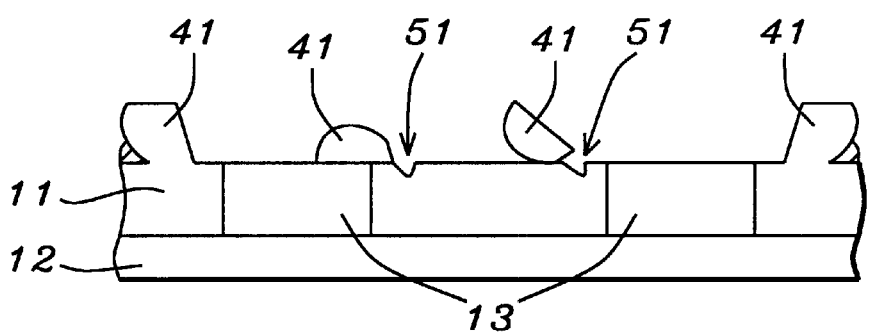
*FIG. 5 - Prior Art*
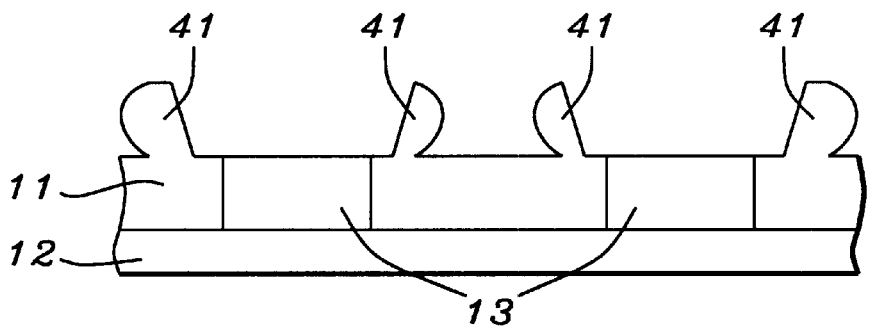
*FIG. 6*

METHOD OF THICK FILM PLANARIZATION

FIELD OF THE INVENTION

The invention relates to the general field of integrated circuits with particular reference to planarizing uneven surfaces, more specifically to surface films greater than about one micron thick.

BACKGROUND OF THE INVENTION

Global planarization of insulating layers formed over depressions and raised portions on a surface can be done by block resist and resist etch back, block resist and spin on glass, and chemical-mechanical polish. Of these chemical-mechanical polish (CMP) gives the highest global planar surface and is now widely used. CMP has been refined over the years in terms of process, equipment, and slurries. In U.S. Pat. No. 5,015,602, Van Der Plas et al. show a method of forming reverse image photoresist over low spots on an insulating surface. The insulating layer is etched and then planarized using CMP. U.S. Pat. No. 4,954,459 ("Method of Planarization of Topologies in Integrated Circuit Structures") and U.S. Pat. No. 6,025,270 ("Planarization Process using Tailored Etchback and CMP") describe other variations of similar concepts. Applying the methods disclosed in these patents does result in improved surface smoothness but these methods are all limited to planarization of dielectric layers having thickness of 1 micron or less.

The dielectric films used in the fields of sensors and optical communications can be much thicker. For instance, in the optical communication field, optical waveguides using a silicon-based dielectric can have a thickness ranging from 1 to 10 microns. Patterning and planarizing such thick dielectric layers presents a different set of problems. For example, as shown in FIG. 1, a dielectric layer 11 has been deposited over a base substrate 12. Elevated peak areas 13 (typically wires), of height h (typically about 6 microns, are separated by gaps, or valleys, 14, with layer 11 being both thick and approximately conformal.

Microstructures of this thickness make it difficult for a thick conformal dielectric layer to be over-laid so that a desired surface conformity is obtained and the gap is completely filled with another dielectric material. To achieve this, various known deposition methods may be used. These methods include plasma-enhance chemical vapor deposition (PECVD), low-pressure chemical vapor deposition (LPCVD), atmospheric-pressure chemical vapor deposition (APCVD), and high-density plasma chemical vapor deposition (HDPCVD). Other deposition methods, which are found more in the research labs, are photon-induced CVD, microwave electron cyclotron resonance CVD, microwave plasma-assisted CVD.

Among the more conventional CVDs, APCVD, HPD-CVD and PECVD have fast deposition rate, low deposition temperature, and somewhat conformal step coverage. LPCVD, on the other hand, gives good conformal step coverage but has low deposition rate and high deposition temperature. Conformal step coverage is coverage in which equal film thicknesses exist over all substrate topography regardless of its slope. Another popular method is flame hydrolysis deposition (FHD). However, when using these methods to deposit a thick layer of dielectric material, hereinafter referred to as an oxide layer, especially by PECVD, HPDCVD, and LPCVD, two distinct features are inherent.

The first feature is shown in FIG. 1, in which the oxide deposited over the microstructures has a cross-sectional trapezoidal structure with downwardly tapering sides and rounded corners. In this instance, the sloping sides of the sidewalls have an angle greater than 90 degrees. It is also possible for the oxide deposited over the microstructures, while still having a trapezoidal cross-section, to have upwardly tapering sides so that the angle θ of the two sidewalls is less than 90 degrees. Using PECVD or LPCVD is more likely to yield a covering similar to that shown in FIG. 1 while using HDPCVD tends to yield coverage that where the angle is less than 90°. These features make the successful planarization of thick deposited materials difficult when conventional prior art approaches to etching and CMP are used.

After the thick conformal oxide layer has been deposited, the next step is to remove the oxide deposited over the microstructures (i.e. the peaked or raised portions of layer 11) so that a planar surface is obtained. The etching process can be either reactive ion etching (RIE) or inductively coupled plasma (ICP) using a mask that is the reverse of the mask that generated the microstructures. Preceding the etching process is the lithography patterning process. This process consists of photoresist coating, pre-bake, exposing according to the mask layout, an optional post exposure bake, and finally developing with or without an optional final hard bake. Photoresist layer 21 is applied, using a spin-on method, to cover the entire oxide layer 11 as shown in FIG. 2.

Due to the large and steep step heights involved, it is difficult to ensure a consistent thickness of the photoresist coating over the full surface of layer 11. The photoresist layer portions over the raised portions of the oxide layer are thinner than the photoresist layer portion in the valleys. For a typical 1 micron photoresist, the photoresist in the valleys is typically 1–about 9,000 Angstroms thicker than that collected at the raised portions. This depends on the severity of the topography and the coating conditions, (particularly spin speed).

After exposing the photoresist through the reverse mask, the thinner coat of photoresist material is then removed. When applying the negative mask, positive and negative bias of the reverse mask can be used. Positive bias will increase the exposing area, i.e. the exposing width is larger than the width of the microstructures. Negative bias will decrease the exposing area, i.e. the exposing width is larger than the width of the microstructures. Note that there are limitations to the amount of bias that can be be applied and disadvantages of microstructures layout, i.e. the spacing between the microstructures. FIG. 3 shows the structure after patterning with light pattern 31.

Due to differences in resist thickness on the peaks (very thin) and in the valleys (very thick), etching proceeds not only in a downward direction but also extends sideways resulting in a cross section as shown in FIG. 4. The remains of the original raised portions now looks very much like horns 41 that extend upwards from the surface of layer 11. If, now, the remaining photoresist is removed and CMP is performed, the horn-like structures 41 tend to break off, causing undesirable dishing 51 in the surface as shown in FIG. 5. This is because the proximal ends of the horn-like structures experience high torsional forces in response to the polishing forces applied to the distal ends of the horn-like structures during CMP. Additionally, the breakaway horn-like structures may get mixed in with the slurry, becoming, in effect, polishing agents. This is undesirable as these horn-like structures are too coarse so they damage the polished surface. Additionally, the breakaway horns can get embedded in the CMP pad which leads to scratching of the surface being polished.

Thus, there exists a need for an efficient and cost effective method to planarize thick layers so as to provide a smooth planar surface.

SUMMARY OF THE INVENTION

It has been an object of at least one embodiment of the present invention to provide a process for chemical mechanical polishing of thick layers having uneven top surfaces made up of peaks and valleys.

Another object of at least one embodiment of the present invention has been that it be applicable to both positively and negatively sloping valley sidewalls.

Still another object of at least one embodiment of the present invention has been that it not require the creation of any new masks.

These objects have been achieved by means of a process that, in its first embodiment, initially allows the formation of 'horns' in the surface that is to be planarized. Said horns are then selectively etched away while other parts of the surface are protected, following which CMP is allowed.

BRIEF DESCRIPTION OF THE DRAWINGS

FIG. 1 illustrates the type of film that needs to be planarized.

FIGS. 2 and 3 show formation of a photoresist mask needed to prepare the surface for planarization.

FIG. 4 shows how etching through the mask of FIG. 2 leads to the formation of 'horns' on the surface.

FIG. 5 illustrates how said horns can break off during CMP and cause problems.

FIG. 6 shows the appearance of the horns after photoresist removal.

DESCRIPTION OF THE PREFERRED EMBODIMENTS

The process for the present invention is the same as the prior art only as far as the point where the horn-like structures 41 have been formed (seen earlier in FIG. 4). The next step is to remove all photoresist, giving the structure the appearance shown in FIG. 6.

Then the surface is coated with layer 71 in a manner (such as spin coating) that causes it to end up thinner on horns 41 (71b) and thicker between said horns (71a), the extent depending on spin speed and resist thickness. While our preferred material for layer 71 has been photoresist, other materials that lend themselves to spin coating, such as spin-on-glass (SOG) or soluble resins could, in principle, have been used. Layer 71 typically had a thickness between about 0.02 and 0.1 microns or about 0.02 and 0.2 microns on the horns and between about 0.3 and 0.6 or about 0.2 and 0.7 microns microns between the horns.

Figure 8:
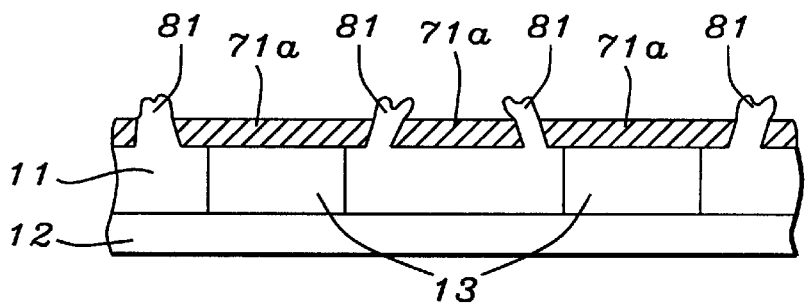

The thinner portions 71b are now selectively removed through use of a standard descum pros, or a light etch, followed by etching that is targeted at the horns 41 so that said horns become reduced in size to become horn remnants 81 as seen in FIG 8. Note that elevated areas 13 continue to be protected even while the horns are shrunk.

Figure 7:
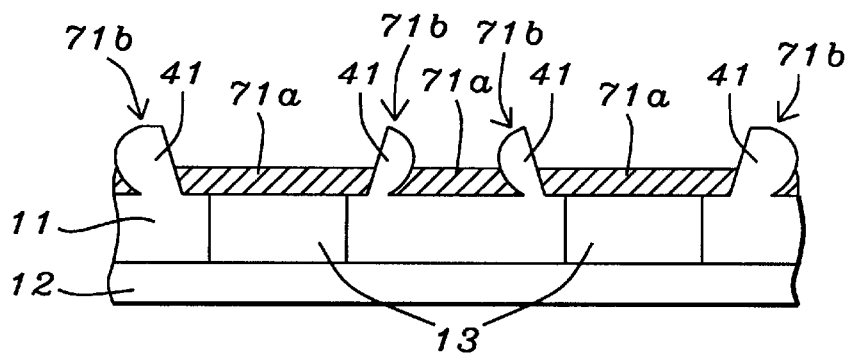
FIGS. 7 and 8 illustrate how, according to the present invention, said horns can be significantly reduced in size.
Figure 9:
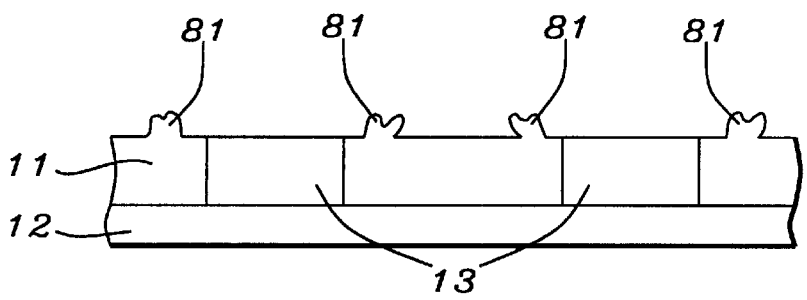
FIG. 9 shows the appearance of horn remnants just prior to initiating CMP.
Figure 10:
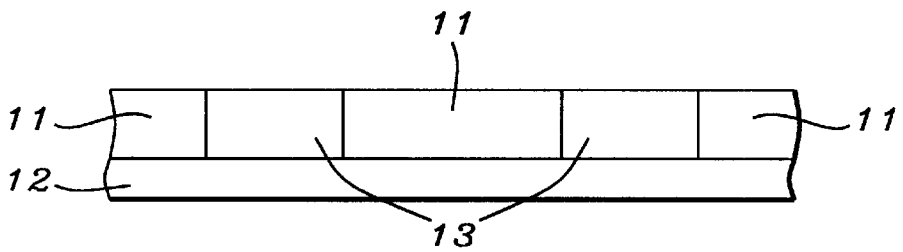
FIG. 10 shows the end product after following the process of the present invention.

At this point all remaining instances of layer 71a are removed, giving the structure the appearance shown in FIG. 9. The process concludes with planarizing by means of chemical-mechanical polishing in the normal way (giving the structure illustrated in FIG. 10) but for very thick or difficult materials it is possible to repeat the steps illustrated in FIGS. 7, 8, and 9 one or more times so as to reduce the size of the horns to safe limits.

What is claimed is:

1. A planarization process comprising:

providing a substrate that includes elevated areas and then fully covering said substrate with a layer of a first material, said layer having an upper surface that includes valleys and raised portions that fully overlap said elevated areas;

coating said upper surface with a layer of photoresist that is thinner on said raised portions and thicker in said valleys;

patterning said layer of photoresist so that it is selectively removed from over said elevated areas thereby forming unprotected areas;

then etching until all unprotected portions of said layer are removed down to the level of said elevated areas, said unprotected areas growing wider as said thinner parts of said photoresist are etched away, thereby removing said raised portions and valleys and forming upwardly projecting horns of said first material;

then removing all remaining photoresist;

then coating said upper surface with a layer of a second material that is thinner on said horns and thicker between said horns;

selectively removing the thinner portions of said layer of a second material and then etching, whereby said horns are reduced in size while said elevated areas continue to be protected;

then removing all remaining instances of said second material; and then planarizing by means of chemical-mechanical polishing.

2. The process described in claim 1 further comprising the steps of:

coating with said second material, forming the horns, and then removing said second material;

is repeated one or more times.

3. The process described in claim 1 wherein the step, of patterning said layer of photoresist so that it is selectively removed from over said elevated areas, further comprises using a mask that is a negative of a mask that was used to pattern said elevated areas.

4. The process described in claim 1 wherein said layer of a first material has a thickness that is between about 1 and 10 microns.

5. The process described in claim 1 wherein said layer of a first material is silicon oxide, silicon oxynitride, silicon nitride, silicon carbide, or silicon oxycarbide.

6. The process described in claim 1 wherein said elevated areas are a dielectric material whose refractive index differs from that of said first material.

7. The process described in claim 1 wherein said layer of photoresist on said raised portions has a thickness that is between about 0.02 and 0.7 microns.

8. The process described in claim 1 wherein said layer of photoresist in said valleys has a thickness that is between about 0.3 and 2 microns.

9. The process described in claim 1 wherein said second material is photoresist, SOG, or a resin.

10. The process described in claim 1 wherein said layer of second material on said horns has a thickness that is between about 0.02 and 0.2 microns.

11. The process described in claim 1 wherein said layer of second material between said horns has a thickness that is between about 0.2 and 0.7 microns.

* * * * *

UNITED STATES PATENT AND TRADEMARK OFFICE
CERTIFICATE OF CORRECTION

PATENT NO.    : 6,617,241 B1                                                Page 1 of 1
DATED         : September 9, 2003
INVENTOR(S)   : My The Doan, Nelson Chou San Loke and Joon Mo Kang It is certified that error appears in the above-identified patent and that said Letters Patent is hereby corrected as shown below:

<u>Title page,</u>
Item [75], Inventor, add -- Nelson Chou San Loke, Taiping Perak, Malaysia -- and -- Joon Mo Kang, Singapore (SG) --.

Signed and Sealed this

Sixteenth Day of December, 2003

JAMES E. ROGAN
*Director of the United States Patent and Trademark Office*